(12) United States Patent
Ortmann et al.

(10) Patent No.: US 7,534,412 B2
(45) Date of Patent: May 19, 2009

(54) LARGE-VOLUME $CAF_2$ SINGLE CRYSTALS WITH REDUCED SCATTERING AND IMPROVED LASER STABILITY, AND USES THEREOF

(75) Inventors: Lars Ortmann, Jena (DE); Joerg Kandler, Cospeda (DE); Andreas Menzel, Jena (DE); Matthias Mueller, Jena (DE); Lutz Parthier, Klein-Machnow (DE); Gordon Von Der Goenna, Jena (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 12/116,995

(22) Filed: May 8, 2008

(65) Prior Publication Data

US 2008/0292535 A1 Nov. 27, 2008

Related U.S. Application Data

(62) Division of application No. 11/063,147, filed on Feb. 22, 2005, now Pat. No. 7,393,409.

(30) Foreign Application Priority Data

Feb. 23, 2004 (DE) ........................ 10 2004 008 749

(51) Int. Cl.
*C01D 3/02* (2006.01)
*C01F 11/22* (2006.01)
*C30B 23/00* (2006.01)
*C30B 25/00* (2006.01)

(52) U.S. Cl. .................... 423/490; 117/84; 117/105; 359/7; 359/322; 359/342

(58) Field of Classification Search ................. 423/490; 117/84, 105; 359/342, 322, 7
See application file for complete search history.

(56) References Cited

U.S. PATENT DOCUMENTS

| 5,705,140 | A  | 1/1998  | Johansing, Jr.  |
| 6,624,390 | B1 | 9/2003  | Motakef et al.  |
| 2001/0025598 | A1 | 10/2001 | Staeblein et al. |
| 2002/0020338 | A1 | 2/2002  | Oba et al.      |
| 2002/0038625 | A1 | 4/2002  | Sakuma et al.   |
| 2002/0166500 | A1 | 11/2002 | Yogo et al.     |
| 2003/0089307 | A1 | 5/2003  | Wehrhan et al.  |
| 2004/0099205 | A1 | 5/2004  | Li et al.       |
| 2004/0154527 | A1 | 8/2004  | Li et al.       |

FOREIGN PATENT DOCUMENTS

| DE | 102 08 157    | 9/2002  |
| DE | 101 42 651    | 3/2003  |
| DE | 10 2004 003 831 | 7/2004 |
| EP | 0 939 147     | 9/1999  |
| EP | 0 942 297     | 9/1999  |
| EP | 0 972 863     | 1/2000  |
| EP | 0 995 820     | 4/2000  |
| EP | 1 234 898     | 8/2002  |
| EP | 1 380 675     | 1/2004  |
| JP | 2001-335398   | 12/2001 |
| JP | 2003327499    | 11/2003 |

OTHER PUBLICATIONS

Shaw et al. "Characterization of materials using an ultraviolet radiometric beamline at SURF III", Metrologia, 2000, 37, 551-554.*
Bernt et al. "IR and visible BSDF measurements of several materials", SPIE vol. 1331 Stray Radiation in Optical Systems, 1990, 261-269.*
Ko et al. "Czochralski growth of UV-grade CaF2 single crystals using ZnF2 additive as scavenger", Journal of Crystal Growth 222, 2001, 243-248.*
Stover, J.C., "Optical Scattering-Measurement and Analysis." P2366 US, McGraw-Hill, Inc. (1990). pp. 14-17.
Mouchovski, J.T., et al, "Growth of Ultra-Violet Grade CaF2 Crystals and Their Application for Excimer Laser Optics." Journal of Crystal Growth 162 (1996) 79-82.
Leckebusch, R., et al, "Perfektion von CAF2-Einkristallen in Abhaengigkeit von der Zuchttechnik." Journal of Crystal Growth 13/14 (1972) 276-281. P2366.
Recker, K., et al, "Zur Zuechtung von CAF2- und CAF2(U)-Einkristallen aus der Dampephase." Journal of Crystal Growth 9 (1971) 274-280.
B. E. Kinsman and R. Hanney "Preparation and Purification of Metal Fluorides for Crystals and Glasses." Advanced Materials for Optics and Electronics, vol. 5, 45-51 (1995).

* cited by examiner

*Primary Examiner*—Vickie Kim
*Assistant Examiner*—Rebecca Lee
(74) *Attorney, Agent, or Firm*—Michael J. Striker

(57) ABSTRACT

Single crystals with low scattering, small refractive index differences and few small angle grain boundaries have a bi-directional scattering distribution function value (BSDF) of less than $1.5*10^{-6}$ or $5*10^{-7}$.

6 Claims, 2 Drawing Sheets

LARGE-VOLUME CAF₂ SINGLE CRYSTALS WITH REDUCED SCATTERING AND IMPROVED LASER STABILITY, AND USES THEREOF

CROSS-REFERENCE

This is a divisional of U.S. patent application Ser. No. 11/063,147, filed on Feb. 22, 2005 now U.S. Pat. No. 7,393,409. The subject matter disclosed in the aforesaid U.S. patent application Ser. No. 11/063,147, is also disclosed in German Patent Application, DE 10 2004 008 749.0, which was filed on Feb. 23, 2004, in Germany. The aforesaid German Patent application provides a basis for a claim of priority of invention under 35 U.S.C. 119 (a)-(d).

BACKGROUND OF THE INVENTION

1. Field of the Invention

The present invention relates to large-volume $CaF_2$ single crystals, which have reduced scattering and improved laser stability, which can be tempered at elevated temperatures and which have an especially great uniformity and low small angle grain boundaries and stress birefringence. The present invention also concerns the uses of these single crystals.

2. Related Art

To manufacture electronic computer components, such as computer chips and other integrated circuits, by optical lithography the structures for those circuits are imaged by means of a photomask on a wafer and it is irradiated. The need for more powerful computers results in a demand for even smaller computer chips. This makes it necessary to produce ever-sharper images of the respective circuit structures. This necessarily also leads to the use of ever-smaller wavelengths. In the meantime the images are even thinner and smaller than the wavelengths of the respective light employed. Thus laser light of wavelengths from 248 to 365 nm, in the meantime, wavelengths of 157 nm to 193 nm, are used in order to image the circuit structures as sharply as possible on the corresponding wafer. Furthermore additional imaging techniques were developed, which permit sharp imaging of those structures, whose lines are smaller than the wavelengths of the light employed. These additional imaging techniques include especially the so-called technologies for improving resolution (Resolution enhancement technology, RET), for example OPC (optical proximity technology), the use of different off-axis illumination techniques, the so-called phase shift masks and double exposure systems. However these high performance technologies are based on the assumption that the optical lens systems and the optical materials are of higher quality. In this connection $CaF_2$ single crystals have attained increasing importance in comparison to synthetic quartz glass as lens material. In fact at working wavelengths of 157 nm only $CaF_2$ can be used, since quartz glass is no longer permeable for light of this wavelength. Up to now large $CaF_2$ single crystals were used in irradiating optics, i.e. the optics for irradiating the photomask.

It is generally known that optical properties of a single crystal depend entirely on the quality of the crystal. Single crystals of this sort are real crystals, i.e. crystals with real lattices that deviate from the theoretical ideal structure and include structural defects. These types of crystal defects e.g. are produced when individual lattice sites are not occupied during growth, which leads to the so-called defect locations, such as point defects, or also to dislocations like linear defects. However faults in the lattice structure are also produced by the unavoidable impurities present, including foreign ions.

The quality, i.e. the perfection of a crystal, depends on the selected growth method and the manner in which it is performed, i.e. especially on the parameters of the method, like the growth rate and the temperatures during growth and cooling. Thus it has been shown that by tempering the crystal, i.e. by heating an already grown crystal over a long time interval at high temperatures the few structural defects, such as small angle grain boundaries and stress birefringence produced by different lattice stress can be dramatically reduced. However it has also been shown that the light scattering in the crystals is greatly increased by long tempering of this sort. Indeed extended tempering increases both the scattering of reflected light and also the scattering of transmitted light. The scattering of reflected light is described by the so-called bi-directional reflection distribution function, BDRF, and the scattering of the light passing through the crystal is described by the so-called bi-directional transmission distribution function, BTDF. Both types of scattering may be combined in the so-called bi-directional scattering distribution function, BSDF. This BSDF is used for quantitative description of the scattering behavior of a sample. For perpendicular incident light it is a function of the scattered light angle $\theta s$ and the scattered light azimuth angle $\phi s$. It describes the behavior of the measured light scattering power Ps in a solid angle, $d\Omega s$, given by the measuring apparatus in relation to the incident power Pi. According to Stover (see J. C. Stover, Optical Scattering—Measurement and Analysis, McGraw-Hill Inc., 1990) it is defined by $$BSDF=(Ps/\Omega s)/(Pi \cos \theta s).$$

The cosine factor projects the irradiated scattering volume on the direction of the scattering angle $\theta s$ and thus allows a directional comparison to light scattering measurements on surfaces. The units of BSDF are 1/stearadian. The power of the scattered light is detected under a solid scattering angle $\theta s$ for characterizing the light scattering behavior of transparent samples, so that the BSDF value is given for $\theta s$=constant as a quantifiable light scattering parameter.

A crystal with light scattering that is already observable with the eye, even if it is comparatively small is not usable or only usable in a limited manner for electronic lithography, especially for image formation optics. Both diffusion scattering and also discrete scattering are troublesome.

This type of crystals may be made in many ways known to those skilled in the art, for example by the most frequently used methods such as the gradient solidification methods (GSM methods) and the Bridgman-Stockbarger method.

R. Leckebusch and K. Recker, in Journal of Crystal Growth 13/14, pp. 276-281 (1972) describe an experiment regarding the perfecting of the manufacture of $CaF_2$ single crystals depending on the crystal growth technique. They report that in vapor-grown crystals, in which evaporated crystal material is deposited on a seed crystal, only a very small number of dislocations were observed on the (111)-cleavage plane because of extremely small growth rates and small temperature gradients within the growing crystal under process conditions in which few impurities were present in the crystal. However this process could produce only small crystals of a few mm size because of the very small growth rates. These small volume crystals were not suitable for use in photolithography. For photolithography crystals with diameters of at least 20 or 30 cm and heights of at least 10 or 20 cm are required. Currently there is a need for single crystals of even significantly larger volume.

Also a large amount of already processed, but not further useable, $CaF_2$ crystals is wasted because of cutting processes and optical properties, which are unsuitable for lithographic applications, such as crystal structural defects, poor homogeneity, large birefringence and poor transmission and/or to large scattering. This waste must be disposed of in a troublesome and cost intensive manner.

SUMMARY OF THE INVENTION

It is an object of the present invention to provide large-volume $CaF_2$ single crystals with high laser stability and reduced scattering, which can be tempered at elevated temperatures without troublesome increases in the scattering and thus have an increased uniformity and improved stress birefringence.

It is also an object of the present invention to provide large-volume $CaF_2$ single crystals, which can be used not only for optical systems that irradiate photo masks, but also for imaging and/or projecting structure.

It is an additional object of the present invention to re-use crystals of this sort obtained from unusable $CaF_2$ waste from earlier crystal growing attempts.

These objects are attained by the features defined in the appended claims.

It was surprisingly found that especially highly temperable scattering-free, but at least low-scattering, large-volume $CaF_2$ single crystals may be made from a melt, when the crystal raw material used for making the melt is evaporated or vaporized previously at a temperature of at least 1100° C. in a vacuum of at most $5*10^{-4}$ mbar and is condensed again at a temperature of at least 500° C. It has been shown according to the invention that a crystal made from a melt of this sort, even at temperatures clearly above the temperatures otherwise used in tempering, has the required uniformity and can be subjected to a heating process reducing the stress birefringence (SDB) without significantly increasing the scattering in the crystal. It has also been shown that the procedure according to the invention neither increases the discrete scattering nor the diffuse scattering to any noteworthy extent. Thus crystals may be obtained with the method according to the invention, which have improved scattering properties, less small angle grain boundaries and improved laser stability. Furthermore crystals obtained by the method of the invention are characterized by an extremely high uniformity and an exceptionally small stress birefringence. It is understandable that the crystals obtained with the method according to the invention, even with lower temperatures in tempering, also have improved scattering properties and laser stability in comparison to those obtained with the current prior art methods.

In a preferred embodiment prior to sublimation the starting material is subjected to a heat treatment. Preferably the treatment temperatures are at least 1000° C., preferably at least 1100° C. and at most 1350° C., preferably 1300° C. A maximum temperature of 1250° C. is most preferred. This sort of heat treatment is performed for a long holding time, especially for a time interval of at least 5 hours, preferably at least 10 hours. A time interval of at least 24 hours, especially at least 48 hours, is especially preferred. The maximum suitable time interval is 120 hours, but a maximum time of 100 hours is preferred. The heat treatment according to the invention eliminates foreign structures in the lattice structure of the starting material, among other things. The crystal structure can be both single crystal and polycrystalline and indeed independently of its particle size, i.e. the material can be in the form of crystal pieces as well as powdery or fragmented.

It is understood that essentially no vaporization of the material to be treated, especially of the $CaF_2$, occurs during the heat treatment or pre-tempering or that the heat treatment is performed so that vaporization of the crystal material is avoided.

According to the invention it has been found that especially pure materials are obtained by a combination of heat treatment and especially fractional sublimation and condensation. Impurities are converted by the heat treatment, especially in large regions by oxide deposition, which remain in the pool or bottom of the vessel, and are not carried over in the sublimation. This facilitates an increased separating action and thus an improved purity for the starting material. Surprisingly this is also true both for powder, granulate and also fragmented starting material.

The tempering holding temperature according to the invention is at least 1000° C., preferably at least 1050° C., wherein at least 1080° C. and/or 1100° C. are especially preferred. A tempering above 1200° C. is particularly preferred, tempering over 1210° C. is most preferred. The upper temperature limit during tempering should not exceed 1415° C., preferably 1370° C. An upper temperature limiting value of at most 1360° C. is preferred, but a value of 1350° C. is particular preferred. Suitable upper temperature limits during tempering amount to at most 1300° C., but a maximum temperature of 1250° C. and/or 1200° C. is sufficient in most cases. According to the invention it has also proven advantageous that there are no or only minimal temperature differences from place to place in the crystal during the holding time interval, i.e. the temperature is kept as uniform as possible through the entire crystal volume during the holding stage.

The tempering is preferably performed at a temperature of at least 1000° C. and is held at the selected tempering temperature for at least 50 hours, preferably 65 hours, especially at least 75 hours. However a holding time of at least 80 hours is particularly preferred.

With the method according to the invention it was found that highly uniform, laser-stable and scattering-free or low scattering large-volume crystals may be made, that the crystalline material is not directly deposited from the vapor phase on the cooled crystal seed, but that the large-volume crystals may be made in a yield with quality that has not been possible to attain up to the present invention, even with the classical GSM method (gradient solidification method), when the $CaF_2$ material is evaporated at a temperature of at least 1200° C. in vacuum at a pressure of at most $5*10^{-4}$ mbar and condensed at a temperature of at least 500° C.

Preferred pressures amount to at least $10^{-7}$ or $5*10^{-7}$ mbar, and especially at least $5*10^{-6}$ or $10^{-6}$ mbar, wherein $5*10^{-5}$ mbar is preferred. Preferred maximum pressure amounts to $3*10^{-4}$ mbar, wherein $10^{-4}$ is preferred. The vaporization itself is preformed in an atmosphere, which is as oxygen-free as possible, in which the oxygen content is preferably <5 ppm, especially <3 ppm, wherein <2 ppm is especially preferred. Oxygen content of <1 ppm (in mol %) is even more preferred, wherein <0.5 ppm, and especially <0.1 ppm, are most preferred.

In a further embodiment according to the invention the vaporization of $CaF_2$ material is performed under a protective gas, especially an inert gas. Helium and argon are preferred inert gases. Furthermore vaporization under a reactive gas, especially hydrogen can be performed according to the invention. Also nitrogen can be used as an inert gas, when its purity is at least 99.99999%.

A preferred vaporization temperature is at least 1100° C., but a temperature of at least 1150° C. is especially preferred.

Usually methods according to the invention employ vaporization temperatures amounting to at least 1200° C. and/or at least 1240° C.

To obtain the raw materials or starting materials used in the method according to the invention $CaF_2$ is deposited from the vapor phase in a collector at a temperature of at least 500° C., especially at least 600° C. Preferably the condenser temperature is at least 20° C., especially at least 30° C. below the vaporization temperature. Especially preferred condensation temperatures are in a range from 40° C. to 60° C., especially about 50° C., below the vaporization temperature. Also when it is not absolutely necessary, it has proven appropriate to use condensation temperatures, which are at most 200° C., especially at most 150° C. or 100° C. below the vaporization temperature. Temperatures of at most 80° C. below the vaporization temperature are especially preferred.

In an additional preferred embodiment a second material condenser, which is further removed from the location of the vaporization process than the first material condenser, is used in the method according to the invention. The second material condenser usually has a lower temperature than the first condenser. An operating and/or condenser temperature difference of at least 20° C., especially at least 30° C., from the temperature of the first condenser has proven suitable. Temperatures of at least 40° C. to 60° C., especially about 50° C., under that of the first condenser temperature are especially preferred. Similarly temperature differences of especially at maximum 200° C. or 150° C., and at most 100° C., between the temperature of the second condenser and the first condenser, are preferred. It is particularly preferred when the temperature at the second condenser is at most 80° C. below that of the first condenser.

The method according to the invention is suitably performed in a closed evacuated apparatus. This apparatus contains a vaporization and condensation chamber. The apparatus comprises a housing defining the chamber and a closure means, especially a cover, which can be opened and closed. The interior of the chamber is thus accessible so that material can be supplied and removed when the closure means is opened. Furthermore this housing, especially the cover, has a small opening, through which the interior of the chamber communicates with the outside and through which the chamber interior can be evacuated. This small opening usually has a small diameter so that during evacuation of the apparatus also a vacuum can be produced in the chamber interior. However this opening is small enough so that only a small part of the $CaF_2$ material in the gas phase can escape. The vaporizer is provided with a heating device and preferably can be heated to the desired temperature. In this apparatus one material condenser is located in a position separated from the site of the vaporization. An easy vapor diffusion path to be determined (first diffusion path) separates the material condenser and vaporizer. The condenser is similarly formed like a plate like the vaporizer and has a lower temperature than the vaporizer. Preferably the condenser can be heated and is adjusted to a smaller temperature than the evaporator or vaporizer. In many embodiments it has proven to be appropriate to provide the condenser with additional cooling mechanisms. In a preferred embodiment an additional second condenser is arranged below or downstream of the first condenser and in an especially preferred embodiment a third condenser is provided. The second condenser is spaced from the first condenser by a diffusion path, which amounts appropriately to 20 to 80% of the first diffusion path. The third diffusion path between the second and third condenser as well as subsequent paths to additional condenser units, which can be condenser units for earlier vaporizing impurities, can be approximately to this value.

In an additional preferred embodiment according to the invention the starting material is placed under a vacuum and heated in a first process step to a vaporizing temperature of 1400° C., preferably to a vaporizing temperature of at most 1350° C., especially 1300° C., until at least 2% by weight, preferably at least 5% by weight and especially at least 10% by weight of the starting material is vaporized. During this time the condenser planes are heated to the same temperature as the vaporizer, in order to prevent the deposition of the vaporized material. A deposition of this material occurs in a separate or preliminary condenser, which is outside of the vaporization chamber in a special embodiment. However it is also possible to arrange this preliminary condenser in the chamber. During the vaporization and condensation of the $CaF_2$ material the $CaF_2$ vapor pressure in the vaporization chamber of the apparatus is at least 0.005 Pa, especially at least 0.01 Pa and at most 0.4 Pa, especially at most 0.3 Pa. An especially preferred lower and/or upper limit amounts to 0.0115 Pa and/or 0.266 Pa. Outside of the vaporization chamber, but within the entire apparatus, the pressure is at most $5*10^{-4}$ mbar. Pressures of at most $10^{-4}$ mbar are especially preferred. Suitably minimum pressures amount to $10^{-7}$ mbar, especially $10^{-6}$ mbar. However minimum pressures of $10^{-5}$ mbar are particularly preferred. The interior of the vessel or vaporization and condensation chamber is connected by means of the foregoing small opening with this pressure or vacuum.

The condensation of material occurs at temperatures, at which undesired residual substances, such as remaining scavenger products still do not deposit. Those temperatures are easily determined by one skilled in the art and depend on the respective selected pressure in the vacuum. It is especially preferred to deposit or separate the material in a temperature gradient and to thus obtain different purity grades as needed. This sort of temperature gradient can be continuous or however preferably occur with appropriate different temperature levels by means of several subsequently connected condenser regions. Preferably at least two, especially at least three, of these regions would be employed.

Larger crystal plates, especially used and/or waste products from previous crystal growth experiment are preferred as starting materials according to the invention. These types of crystal plates can be both single crystal fragments or pieces and also polycrystalline. Thus it is preferred to wash these plates or fragments prior art use in order to remove troublesome exterior impurities, such as NaCl and/or fats and air dirt and oxidation products, especially hydroxides, sulfate, carbonates and nitrates, etc., which are present on the surface of these plates or fragments. These fragments or plates are washed preferably in aqueous media. The aqueous wash media is preferably an aqueous surfactant solution, which preferably comprises a non-ionic surfactant. Principally it is also possible according to the invention to use an amphoteric surfactant and also a cationic surfactant if necessary, especially with fluoride as a counter ion. Preferably the surfactant solution used in the method according to the invention does not generate foam.

Preferred surfactants, for example, are amino-alcohols, such as 2-amino-2-methylpropanol. These latter surfactants are obtainable commercially under the trademark VIGON® A 200 or, for example, under the trademark NEODISHER® EM.

After washing the fragments are dried, which preferably happens at temperatures about 50° C., especially above 60° C.

and preferably above 80° C. The drying is preferably performed under vacuum, if necessary under protective gas.

The fragments are comminuted after washing and drying, which for example can happen by a breaking process conducted by impact or shock stress. This produces fragment pieces with sizes of 0.1 to 10 cm and typically from 0.5 to 5 cm, with a $d_{50}$ of 0.5 to 3 cm, preferably 1 to 2 cm.

The method according to the invention produces preliminary products, which make possible the manufacture of crystals with the known procedure according to the so-called gradient solidification method (GSM). Additional methods that can be used for industrial mass production include, e.g., the Bridgman-Stockbarger method, the Vertical-Gradient-Freeze method, the Nacken-Kyropoulos method and the Czochralski method and variants of these methods. In this procedure polycrystalline material is melted in a vessel or crucible and subsequently the melt is slowly allowed to solidify, preferably by means of a seed crystal, in a controlled manner. All the above-described methods produce crystals, crystal fragments and polycrystalline powder from $CaF_2$ as starting material, which is suitable for the method according to the invention.

The invention also concerns the large-volume crystals, which are obtained from the method according to the invention. The inventive crystals have high laser stability, high uniformity and low scattering after tempering. Moreover they also have a low stress birefringence.

The crystals according to the invention have a BSDF value of $<5*10^{-7}$ especially $<4*10^{-7}$. These values were not previously obtained in the prior art. Preferably the crystals according to the invention have a BSDF value of $<2*10^{-7}$, especially $<1*10^{-7}$. Values of $<4*10^{-7}$ are especially preferred. The RMS average values for refractive index uniformity are preferably at least $<5*10^{-8}$, especially at least $<2*10^{-8}$ (after deducting 36 Zernike coefficients). RMS values for refractive index uniformity of $<1.5*10^{-8}$ are particularly preferred. The RMS average values of the stress birefringence (SDB-RMS) in the (100)- and in the (110)-direction or orientation amount to preferably <1 nm/cm, especially <0.35 nm/cm, wherein <0.3 nm/cm is particularly preferred. The RMS average values of the stress birefringence (SDB-RMS) in the (111)-direction or orientation amounts to preferably <0.2 nm/cm, especially <0.15 nm/cm, wherein <0.08 nm/cm is particularly preferred. To determine the laser or laser beam resistance the crystals according to the invention are exposed to $10\times10^9$ laser pulses of wavelength of 193 nm and an energy density of 10 mJ/cm². No change in the $k_0$-value was observed as a results of this laser resistance test.

After growth the crystals according to the invention preferably have a diameter of at least 20 cm, preferably 30 cm, and a height of at least 10 cm, preferably at least 20 cm. Diameters of at least 35 cm or 40 cm and heights of at least 25 cm or 30 cm are especially preferred. The crystals preferably have an oxygen content of <6 ppm, especially <3 ppm, however <1 ppm is particularly preferred. The carbon content is preferably <18 ppm, and especially <10 ppm. However a carbon content of <8 ppm is especially preferred.

The present invention also concerns the uses of the crystals obtained by the method for optical purposes, especially as blanks or semi-finished articles for optical elements. Microlithography, especially microlithography at wavelengths <250 nm, especially at 248 nm and/or 193 nm and preferably at 157 nm, is a preferred application for the crystals obtained by the method according to the invention.

The invention also concerns the use of this sort of crystals for optical elements, especially prisms and lenses, which are used in optical apparatus, especially as objectives. The crystals according to the invention especially can be used in microlithography and photography, especially for making steppers, excimer lasers, wafers, computer chips, as well as integrated circuits and electronic equipment, which contains this sort of circuit and/or chip.

BRIEF DESCRIPTION OF THE DRAWING

The objects, features and advantages of the invention will now be illustrated in more detail with the aid of the following examples, in which.

EXAMPLES

The following examples are illustrative of the method according to the invention, but should not be considered to limit the appended claims.

Figure 1:
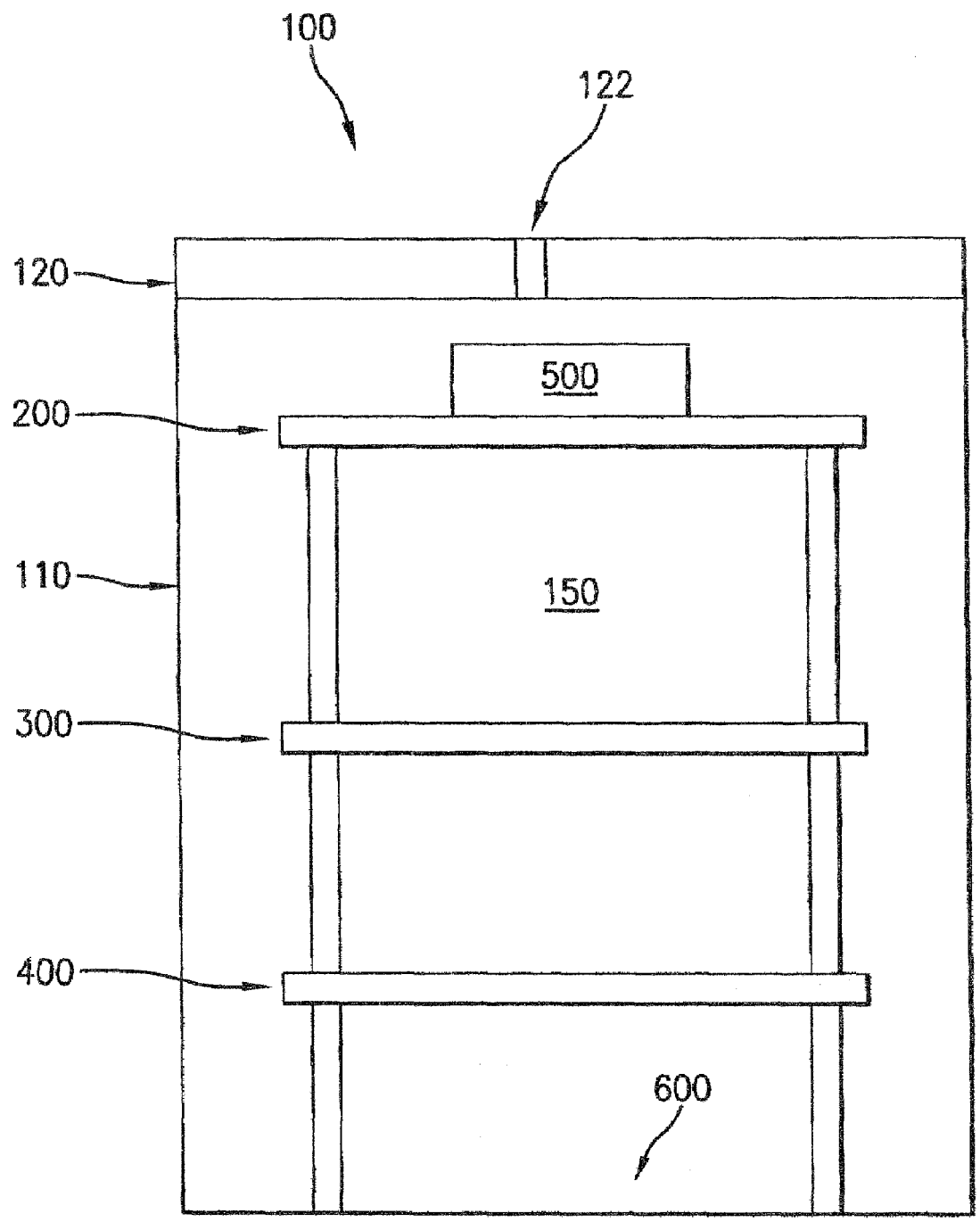
FIG. 1 is a schematic side sectional view of a vacuum sublimation apparatus for performing the method according to the invention.

A vacuum sublimation apparatus for performing the method according to the invention is shown in FIG. 1. The apparatus includes a vessel or housing 100 with a vessel or housing wall and bottom 110 and a cover 120. The cover 120 is removable from the housing wall and bottom 110. The cover 120 has a small but sufficiently large opening 122 in the form of a through-going hole. The housing itself defines a vaporization and condensation chamber 150, which communicates via the opening 122 with the exterior, i.e. a vacuum reservoir. An additional housing within the apparatus, in which the housing 100 is housed, can provide the vacuum reservoir. Heatable, and if necessary, also coolable plane surfaces, plates and/or pans 200, 300, 400 are arranged in the chamber 150. The material 500 to be vaporized or evaporated is placed on the upper plane surface 200. When the plane surface or pan 200 is heated to the operating temperature by a heating device (not shown in the drawing), the material 500 evaporates or vaporizes and is deposited on the plane surface 300 below the surface 200, which has a lower temperature than the vaporization plane surface 200. The condensation plane surface 300 is separated from the vaporization plane surface 200 by a diffusion path D1. An additional condensation plane surface 400, which condenses the residual vaporized material 500 not deposited on the condensation plane surface 300, is located below the condensation plane surface 300. If necessary a condensation and/or collection dish for unwanted material already evaporated at lower temperatures can be arranged on the lowest plane surface (which is not shown in the drawing). Principally each condensation plane surface and/or dish or pan has a lower temperature than the corresponding condensation plane surface and/or dish or pan immediately above it, so that a fractional deposition of evaporated material 500 occurs. The material condensed on the first plane surface 300 is usually the purest material, which is preferably used in the method according to the invention. The material so obtained is usually already large-grained, i.e. single or polycrystalline, so that no prior compacting is required to make a melt during subsequent application, i.e. the process step for making an ingot can be eliminated according to the invention.

Example 1

Starting Material Preparation

Waste comprising unusable crystals and old fragments from cuttings during lens manufacture were placed in a wash basket of an automatic washer, Miele Automatic Washer Type G7827, and arranged in the wash basket with a spacing of at least 1 cm from each other. In this way it is guaranteed that the crystal fragments are completely washed during the wash process. Fragments, which still have markings on the outer sides, for example felt pen markings, are freed of them by breaking those regions off. The wash basket is loaded with a fragment mass of 12 to 18 kg, placed in a wash carriage and subsequently conveyed through the automatic washer with a conveying vehicle. A wash program is subsequently selected in the automatic washer (wash program Nr. 20) and the wash carriage is removed again after the wash program finishes (90 minutes). During the washing the conductivity of the water should be checked to make certain that it remains within a predetermined range. If necessary a new desalting cartridge should be installed at the correct time.

After washing the fragments are placed in a drying basket and evaluated visually. Fragments, which have a residual coloration, are sorted out and if necessary further purified by breaking off pieces. After that the baskets are dried in a vacuum oven. Usually three drying cycles are performed after each wash process. During the drying the vacuum drying oven (Drying Oven Binder Type VD 115) is heated to 90° C. and held at that temperature for one hour. The vacuum is in a range from 10 to 2 mbar. After the drying the fragments are subjected to a visual control evaluation again and as before residual colorations are removed by break off methods. After that the fragments with an edge length of >5 cm are comminuted with gentle hammer impacts. This above all is possible because the fragments have many fractures or cracks because of the washing and drying process. The broken pieces are then filled in a plastic box and then in an amount of 5 kg sealed together with the box in a foil bag by means of a vacuum welding apparatus and then stored for their further use.

Example 2

Single-Stage Sublimation 5 kg of the previously cleaned raw fragments 500 are placed on an evaporation or fragment plane surface 200 in a vacuum sublimation apparatus according to FIG. 1. After closing a cover 120 and drawing an apparatus vacuum of $10^{-4}$ to $10^{-5}$ mbar in the apparatus a processing temperature of 1100° C. to 1250° C. is set and maintained. Three condensers are arranged on three condenser plane surfaces 300, 400 and 600, which are located one above the other in the apparatus. Each condenser plane has a lower temperature by about 50° C. below the temperature of the plane immediately above it. The sublimation thus occurs from above to below. The sublimate travels along the wall 110 according to the temperature to the individual sublimation plane surfaces 300, 400, 600. The best material is found on the upper condensate plane surface 300. The pressure within the $CaF_2$-vapor and condensate chamber amounts to 0.0115 to 0.266 Pa. About 72 hours were required for vaporization of about 90% of the mass of the raw fragments 500 at a temperature of 1250° C.

Example 3

Two-Stage Method

As described above 5 kg of raw fragments 500 were placed in the vaporization chamber 150 and held for 18 hours in a first process stage at temperatures between of 1100° C. to 1250° C. During this time both the vaporization plane surface 200 and also the condensation plane surfaces 300, 400, 600 were held at the same temperatures in order to avoid condensation of the previously vaporized raw material with less volatile impurities. It has also proven to be suitable to perform this stage if necessary in a reduced vacuum, i.e. at higher pressures, than the later vaporization. The actual vaporization occurs subsequently at an elevated temperature appropriately above 1250° C. for a time interval of 56 hours. In this way of course the yield is reduced (only 75% of the raw materials) but the purity of the material deposited in the condenser is considerably improved.

The vaporizer 200 is heated by a heater (not shown in the drawing), which heats the vaporization vessel and/or the plane over its entire extent. The temperatures of the condenser planes 200, 300, 600 are subsequently exactly adjusted by separate heating and cooling elements (which are likewise not shown in FIG. 1).

Example 4

Optical Quality of the Crystals Obtained

In order to determine the effect of a procedure of the above-described type on the finished crystals, which are made from a melt comprising material obtained according to examples 1 to 3, small test crystals were grown and compared with similarly made crystals, which were made from untreated fragments and from commercially prepared purified synthetic high purity $CaF_2$ powder. It has been shown that substantially higher quality optical elements may be made from the crystals obtained by the method according to the invention than can be made with the prior art material. The crystals according to the invention not only have a higher laser radiation resistance but also a clearly reduced inclination to scatter light. The results are tabulated in the following Table I.

In this table examples E1 to E8 are crystal samples obtained by the method according to the invention and comparative examples V1 to V4 are crystals obtained from commercial $CaF_2$ powder.

TABLE I

COMPARISON OF OPTICAL PROPERTIES OF CALCIUM FLUORIDE SINGLE CRYSTALS OF THE INVENTION WITH THOSE OF THE PRIOR ART

| Sample | Scattering Class | Input Powers | Average BSDF × $10^7$ | Number of Measured Points, MP | Observations |
|---|---|---|---|---|---|
| E1 | 0 |  | 1.45 | 5 MP | Very uniform! |
| E2 | 0 | 10.6 … 11.5 | 1.97 | 5 MP |  |
| E3 | 0 |  | 3.38 | 5 MP | Very uniform! |
| E4 | 0 |  | 2.06 | 5 MP | Uniform Scattering! |
| E5 | 0-1 | 9.4 … 9.7 | 8.65 |  |  |
| E6 | 0-1 | 12.0 … 12.2 | 1.73 |  | Cloudy |
| E7 | 0-1 | 8.7 | 32.9 |  | Cloudy |

TABLE I-continued

COMPARISON OF OPTICAL PROPERTIES OF CALCIUM FLUORIDE SINGLE CRYSTALS OF THE INVENTION WITH THOSE OF THE PRIOR ART

| Sample | Scattering Class | Input Powers | Average BSDF × $10^7$ | Number of Measured Points, MP | Observations |
|---|---|---|---|---|---|
| E8 | 0-1 | 6.1 ... 6.2 | 3.79 | 5 MP | Uniform Scattering! |
| V1 | 0-1 | 8.8 ... 8.9 | 9.57 | | Cloudy |
| V2 | 0-1 | 10.6 ... 11 | 5.43 | | Cloudy |
| V3 | 0-1 | 10.1 | 12.65 | 5 MP | Cloudy |
| V4 | 0-1 | 11.2 ... 11.3 | 5.26 | 5 MP | |

Tests for Spectra Formation after X-ray Irradiation

Figure 2:
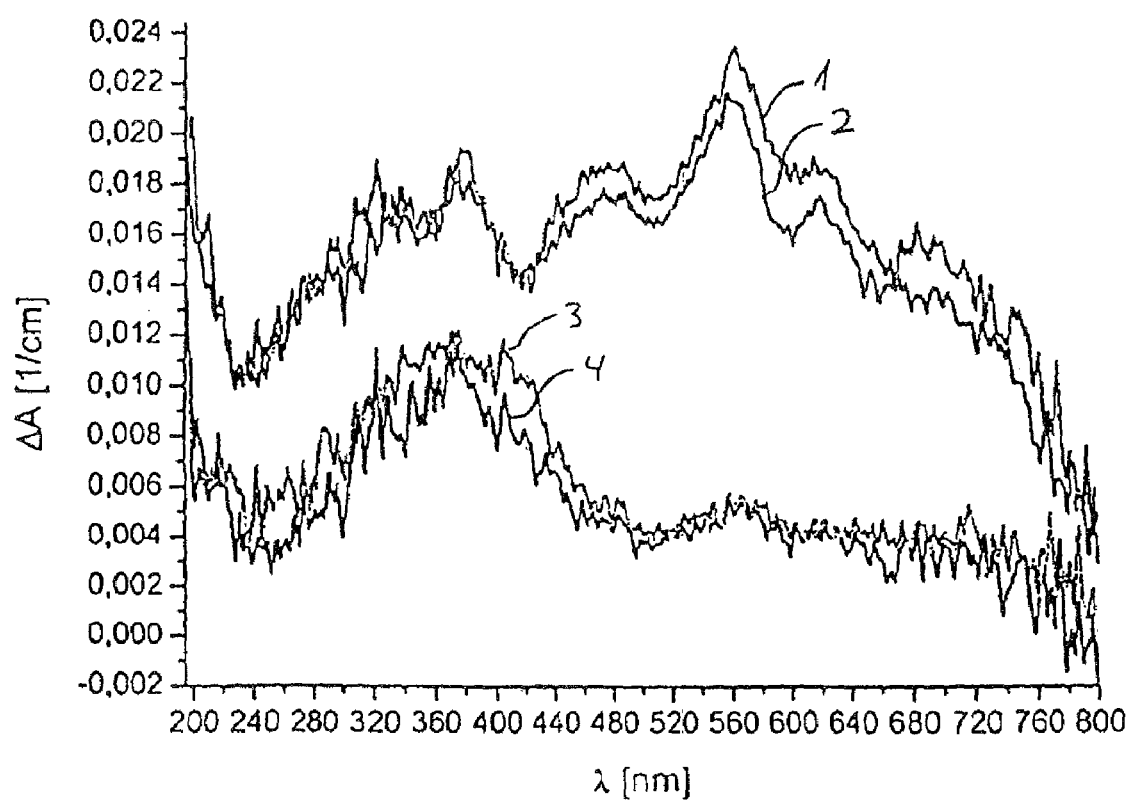
FIG. 2 is a graphical illustration showing the difference spectra for calcium fluoride crystals according to the invention before and after irradiation with X-rays.

The difference spectra after X-ray damage—at wavelengths between 320 nm and 800 nm—were measured. The material was irradiated with X-ray radiation with an intensity of about 20 mJ/cm². FIG. 2 shows the absorption spectra from 200 nm to 800 nm, which was obtained from the crystals, which were obtained from the raw fragments as well as from the material obtained according to the invention. A difference spectrum before and after irradiation is shown in FIG. 2.

Curves 1 and 2 are for crystals not according to the invention and are clearly poorer than the curves 3 and 4 obtained for the crystals of example 1 and the crystal of example 2 according to the invention.

The results obtained according to the invention are even more surprising since they are obtained with previously used material designated as unusable, while no crystals of similar quality could be obtained from synthetic high purity starting material according to the prior art.

The disclosure in German Patent Application 10 2004 008 749.0-43 of Feb. 23, 2004 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in large-volume $CaF_2$ single crystals with reduced scattering and improved laser stability and to the single crystals made thereby as well as their uses, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. A large-volume $CaF_2$ single crystal with reduced scattering, which is temperable at 1000° C. and above, has a bi-directional scattering distribution function (BSDF) value of less than $1.5*10^{-6}$ or $5*10^{-7}$.

2. The large-volume $CaF_2$ single crystal as defined in claim 1, having an RMS average value of stress birefringence (SDB) of less than 0.3 nm/cm in a (100)-direction.

3. The large-volume $CaF_2$ single crystal as defined in claim 1, having a PV value of stress birefringence of less than 0.5 nm/cm and/or an RMS average value of the stress birefringence of less than 0.15 nm/cm in a (111)-direction and/or a PV value of the stress birefringence of less than 2.5 nm/cm and/or an RMS average value of the stress birefringence of less than 1 nm/cm in a (110) direction and/or the (100)-direction.

4. The large-volume $CaF_2$ single crystal as defined in claim 1, having an RMS average value of the stress birefringence of less than 0.3 nm/cm in a (100)-orientation and an RMS value of refractive index infirmity, after deduction of 36 Zernike coefficients, of less than $1.5 \times 10^{-8}$.

5. The large-volume $CaF_2$ single crystal as defined in claim 1, having an oxygen content of less than 3 ppm and/or a carbon content of less than 10 ppm.

6. The large-volume $CaF_2$ as defined in claim 5, wherein said carbon content is less than 8 ppm.

* * * * *